United States Patent
Xing

(10) Patent No.: US 10,573,216 B2
(45) Date of Patent: Feb. 25, 2020

(54) DRIVING CONTROL METHOD BY SEQUENTIALLY TURNING ON ALL OF THE FIRST, ALL OF THE SECOND, ALL OF THE THIRD AND ALL OF THE WHITE COLOR SUB-PIXELS FOR DISPLAY PANEL

(71) Applicant: Wuhan China Star Optoelectronics Technology Co., Ltd., Wuhan, Hubei (CN)

(72) Inventor: Zhenzhou Xing, Guangdong (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 163 days.

(21) Appl. No.: 15/576,995

(22) PCT Filed: Aug. 22, 2017

(86) PCT No.: PCT/CN2017/098452
§ 371 (c)(1),
(2) Date: Nov. 27, 2017

(87) PCT Pub. No.: WO2019/019239
PCT Pub. Date: Jan. 31, 2019

(65) Prior Publication Data
US 2019/0035318 A1    Jan. 31, 2019

(30) Foreign Application Priority Data
Jul. 27, 2017   (CN) .......................... 2017 1 0624071

(51) Int. Cl.
G09G 5/10    (2006.01)
G09G 3/20    (2006.01)
H01L 27/12   (2006.01)

(52) U.S. Cl.
CPC ......... *G09G 3/2003* (2013.01); *H01L 27/124* (2013.01); *G09G 2300/0452* (2013.01);
(Continued)

(58) Field of Classification Search
CPC ............................ G09G 3/2003; H01L 27/124
See application file for complete search history.

(56) References Cited

U.S. PATENT DOCUMENTS 7,804,466 B2    9/2010  Kwak et al.
2005/0200617 A1*  9/2005  Kwak ................. G09G 3/3233
                                                    345/204
(Continued)

FOREIGN PATENT DOCUMENTS

CN    101226291 A      7/2008
CN    105590600 A  *   5/2016   ........... G09G 3/2003
(Continued)

*Primary Examiner* — Adam J Snyder
(74) *Attorney, Agent, or Firm* — Andrew C. Cheng

(57) ABSTRACT

A driving control method is disclosed. The method includes steps of sequentially turning on the first color sub-pixel, the second color sub-pixel, the third color sub-pixel and the white color sub-pixel respectively in the first time period, the second time period, the third time period, and the fourth time period in order to respectively input grayscale values of the sub-pixels using the source driver. Wherein, when using the source driver to input the grayscale vale of the white color sub-pixels, the source driver decreases a preset value of gamma voltages of the white color sub-pixels such that the preset value of gamma voltages when inputting grayscale values of the white color sub-pixels is less than a preset value of gamma voltages when inputting grayscale values of the first color sub-pixels, the second color sub-pixels and/or the third color sub-pixels. Through the above way, the display quality can be increased.

13 Claims, 3 Drawing Sheets

(52) U.S. Cl.
CPC ............... *G09G 2300/0809* (2013.01); *G09G 2310/027* (2013.01); *G09G 2310/0235* (2013.01); *G09G 2310/08* (2013.01); *G09G 2320/0242* (2013.01); *G09G 2320/0276* (2013.01); *G09G 2320/0673* (2013.01)

(56) References Cited

U.S. PATENT DOCUMENTS

| | | | |
|---|---|---|---|
| 2009/0207182 A1 | 8/2009 | Takada | |
| 2010/0103187 A1* | 4/2010 | Linssen | G09G 3/2003 345/590 |
| 2014/0085170 A1* | 3/2014 | Park | G09G 5/02 345/83 |
| 2016/0071473 A1 | 3/2016 | Ahn | |
| 2017/0140716 A1* | 5/2017 | Xu | G09G 3/3406 |
| 2017/0243528 A1* | 8/2017 | Ji | G09G 3/2003 |

FOREIGN PATENT DOCUMENTS

| | | |
|---|---|---|
| CN | 106531096 A | 3/2017 |
| CN | 106531101 A | 3/2017 |

\* cited by examiner

DRIVING CONTROL METHOD BY SEQUENTIALLY TURNING ON ALL OF THE FIRST, ALL OF THE SECOND, ALL OF THE THIRD AND ALL OF THE WHITE COLOR SUB-PIXELS FOR DISPLAY PANEL

BACKGROUND OF THE INVENTION

1. Field of the Invention

The present invention relates to a display technology field, and more particularly to a driving control method for a display panel.

2. Description of Related Art

A liquid crystal display panel has advantages of low voltage, low power consumption, large display information, colorful display, etc. Currently, the liquid crystal display panel has occupied a dominant position in the display market, and has been widely adopted in electronic computer, electronic notepad, mobile phone, camera, high-definition TV and other electronic equipment.

Along with the increase of energy conservation and environmental awareness of people and the trend of development of lightweight of electronic equipment, power saving and lightweight volume, has been valued by manufacturer and consumer. Display technology of four primary colors of RGBW adds a white sub-pixel in order to increase transmittance of the display panel. By using a subpixel sharing algorithm, under a premise of not changing the resolution, one third of pixels can be reduced in order to decrease the risk of production yield of ultra-high resolution display panel, and decrease 40% of power consumption of backlight and increase the picture contrast at the same time.

In a long research by the inventors of the present application, the RGBW four-primary color display panel exist a problem that the pure color is dimmed. As shown in FIG. 1, along with the decreasing of the turned-on percentage of the white sub-pixel of the RGBW panel, the phenomenon that the pure color is dimmed can be improved. That is, when the turned-on percentage of the white sub-pixel is increased, the phenomenon that the pure color is dimmed is more serious.

SUMMARY OF THE INVENTION

The main technology problem solved by the present invention is to provide a driving control method for a display panel, which can increase the display quality of the display panel.

In order to solve the above technology problem, a technology solution adopted by the present invention is: providing a driving control method for a display panel, wherein, the display panel includes multiple pixels arranged as a matrix, each pixel includes a first color sub-pixel, a second color sub-pixel, a third color sub-pixel and a white color sub-pixel, each sub-pixel is corresponding to a thin film transistor, and each sub-pixel is connected with a corresponding scanning line and a corresponding data line through the corresponding thin film transistor, and the method comprises:

in a first time period, sequentially turning on all of the first color sub-pixels of the display panel, and using a source driver to respectively input grayscale values of the first color sub-pixels;

in a second time period, sequentially turning on all of the second color sub-pixels of the display panel, and using the source driver to respectively input grayscale values of the second color sub-pixels;

in a third time period, sequentially turning on all of the third color sub-pixels of the display panel, and using the source driver to respectively input grayscale values of the third color sub-pixels;

in a fourth time period, sequentially turning on all of the white color sub-pixels of the display panel, and using the source driver to respectively input grayscale values of the white color sub-pixels;

wherein, a sum of the first time period, the second time period, the third time period, and the fourth time period is a writing period of one frame picture; when using the source driver to respectively input grayscale values of the white color sub-pixels, the source driver decreases a preset value of gamma voltages of the white color sub-pixels such that the preset value of gamma voltages when inputting grayscale values of the white color sub-pixels is less than a preset value of gamma voltages when inputting grayscale values of the first color sub-pixels, the second color sub-pixels and/or the third color sub-pixels.

In order to solve the above technology problem, a technology solution adopted by the present invention is: providing a driving control method for a display panel, wherein, the display panel includes multiple pixels arranged as a matrix, each pixel includes a first color sub-pixel, a second color sub-pixel, a third color sub-pixel and a white color sub-pixel, and the method comprises:

in a first time period, sequentially turning on all of the first color sub-pixels of the display panel, and using a source driver to respectively input grayscale values of the first color sub-pixels;

in a second time period, sequentially turning on all of the second color sub-pixels of the display panel, and using the source driver to respectively input grayscale values of the second color sub-pixels;

in a third time period, sequentially turning on all of the third color sub-pixels of the display panel, and using the source driver to respectively input grayscale values of the third color sub-pixels;

in a fourth time period, sequentially turning on all of the white color sub-pixels of the display panel, and using the source driver to respectively input grayscale values of the white color sub-pixels;

wherein, when using the source driver to respectively input grayscale values of the white color sub-pixels, the source driver decreases a preset value of gamma voltages of the white color sub-pixels such that the preset value of gamma voltages when inputting grayscale values of the white color sub-pixels is less than a preset value of gamma voltages when inputting grayscale values of the first color sub-pixels, the second color sub-pixels and/or the third color sub-pixels.

The beneficial effect of the present invention is: comparing to the conventional art, the present invention sequentially turns on the first color sub-pixel, the second color sub-pixel, the third color sub-pixel and the white color sub-pixel respectively in the first time period, the second time period, the third time period, and the fourth time period in order to respectively input grayscale values of the sub-pixels using the source driver. Wherein, when using the source driver to input the grayscale vale of the white color sub-pixels, the source driver decreases a preset value of gamma voltages of the white color sub-pixels such that the preset value of gamma voltages when inputting grayscale values of the white color sub-pixels is less than a preset value of gamma voltages when inputting grayscale values of the first color sub-pixels, the second color sub-pixels and/or the third color sub-pixels. Through the above way, the brightness of the white sub-pixel can be decreased in order to improve the dimmed pure color problem, and increase the display quality.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

DETAILED DESCRIPTION OF THE PREFERRED EMBODIMENT

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

Figure 1:
FIG. 1 is a schematic comparison diagram of a RGB display and a RGBW display panel.
Figure 2:
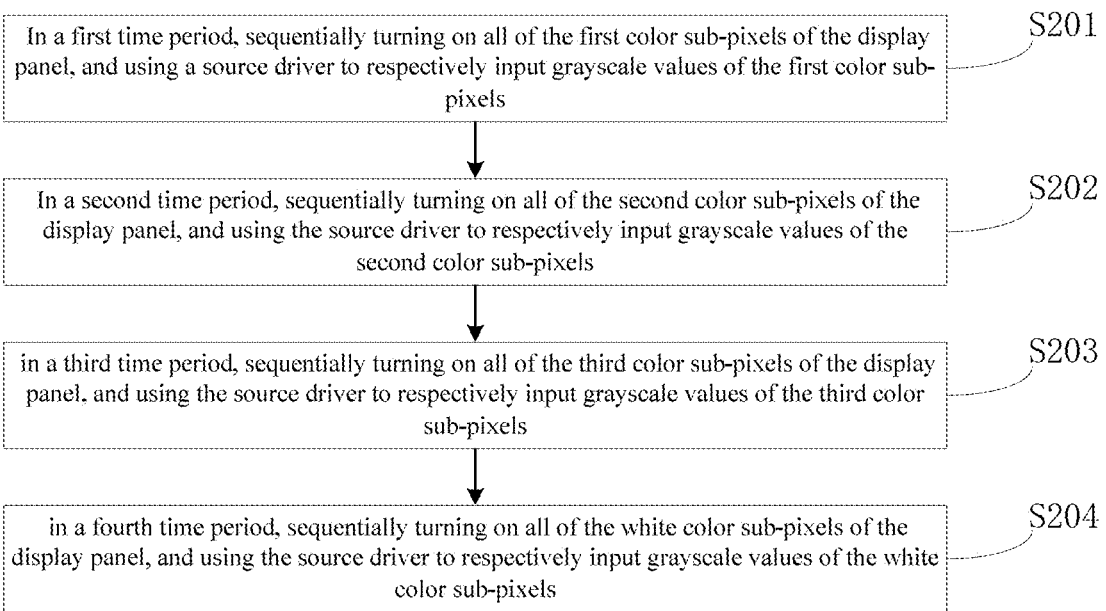
FIG. 2 is a schematic flow chart of a driving control method for a display panel according to an embodiment of the present invention.
Figure 3:
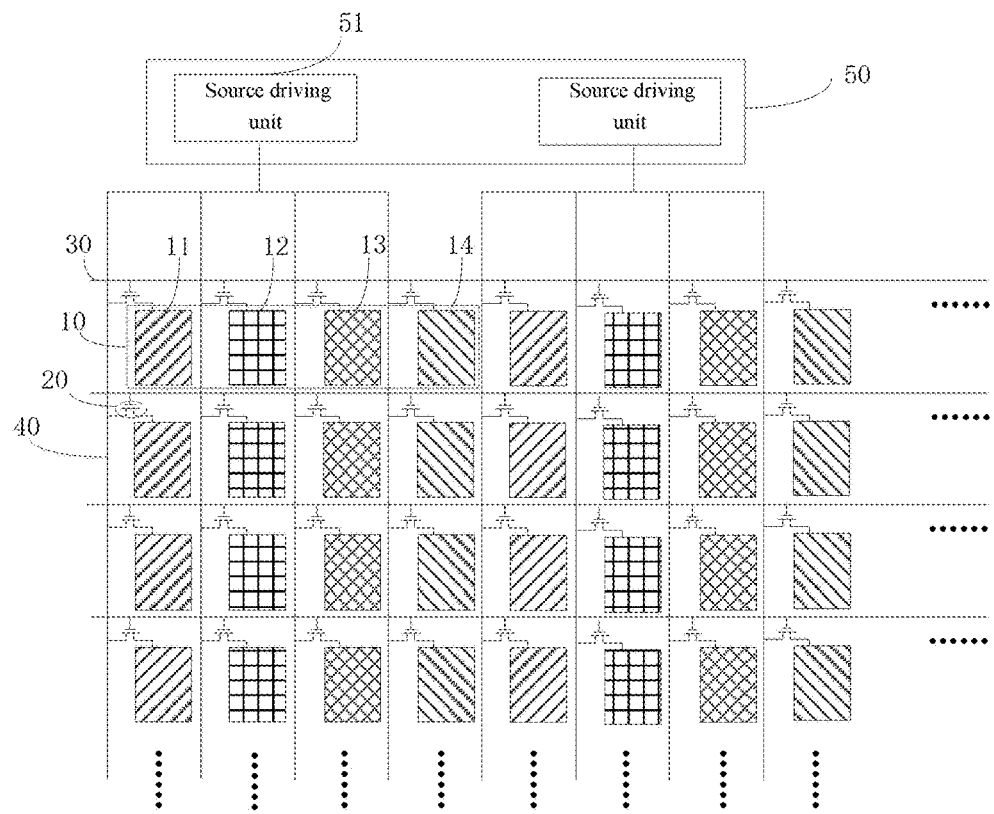
FIG. 3 is a schematic structure diagram of the display panel under an application.

With reference to FIG. 2 and FIG. 3, FIG. 2 is a flow chart of a driving control method of a display panel according to an embodiment of the present invention, and FIG. 3 is a schematic diagram of a display panel according to an embodiment of the present invention.

The display panel includes multiple pixels 10 arranged as a matrix. Each pixel 10 includes a first color sub-pixel 11, a second color sub-pixel 12, a third color sub-pixel 13 and a white color sub-pixel 14. Optionally, each sub-pixel is corresponding to a thin film transistor 20, and each sub-pixel is connected with a corresponding scanning line 30 and a corresponding data line 40 through the corresponding thin film transistor 20

Figure 4:
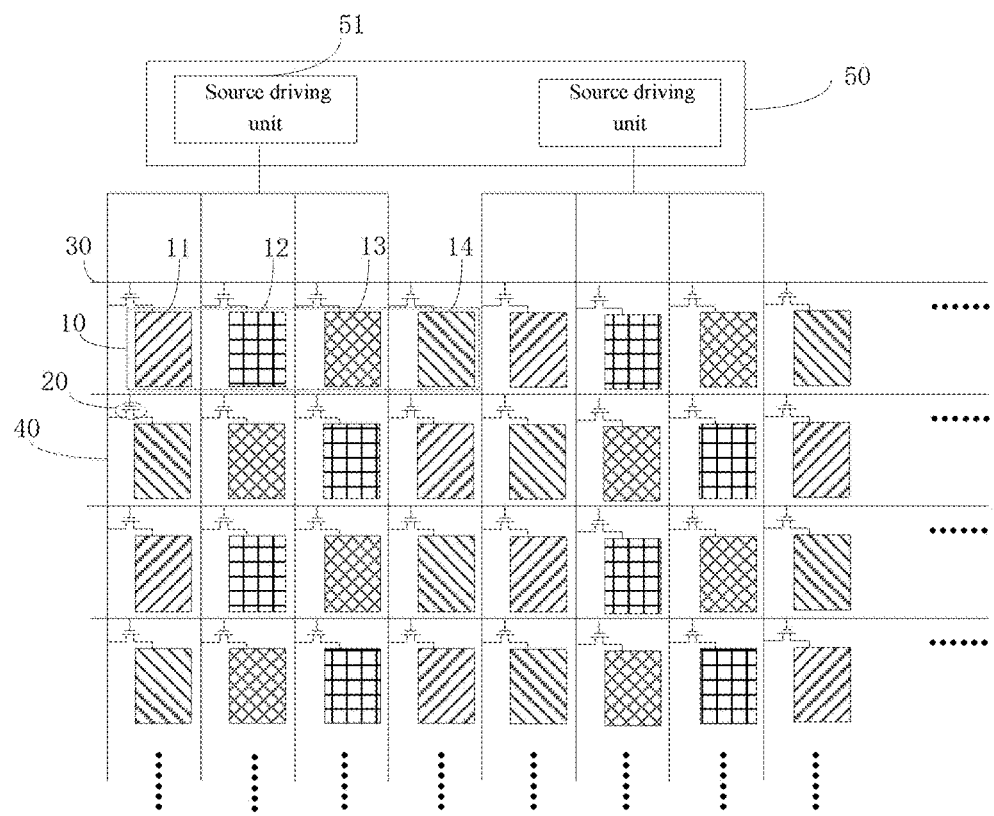
FIG. 4 is a schematic structure diagram of the display panel under another application.

Optionally, as shown in FIG. 3, in one application, the first color sub-pixels 11, the second color sub-pixels 12, the third color sub-pixels 13 and the white color sub-pixels 14 are arranged in a column-by-column manner, and between two adjacent columns having a same color, columns having the other colors of the sub-pixels are distributed. That is, the first color sub-pixel 11, the second color sub-pixel 12, the third color sub-pixel 13 and the fourth color sub-pixel 14 are arranged in a preset sequence. Of course, in another application, as shown in FIG. 4, arrangement sequences of the first color sub-pixels 11, the second color sub-pixels 12, the third color sub-pixels 13 and the fourth color sub-pixels 14 located at two adjacent rows and in adjacent two pixels 10 are opposite. It should be noted that in the present embodiment, the arrangement manner of the first color sub-pixel 11, the second color sub-pixel 12, the third color sub-pixel 13 and the fourth color sub-pixel 14 is not limited, and a designer can design based on actual requirement.

Optionally, in one application of the present embodiment, the first color sub-pixel 11, the second color sub-pixel 12 and the third color sub-pixel 13 are respectively a red sub-pixel (R), a green sub-pixel (G) and a blue sub-pixel (B). Of course, in other application, the first color sub-pixel 11, the second color sub-pixel 12, and the third color sub-pixel 13 can be other color sub-pixels.

In the present embodiment, the driving control method of the display panel includes:

S201: in a first time period, sequentially turning on all of the first color sub-pixels 11 of the display panel, and using a source driver 50 to respectively input grayscale values of the first color sub-pixels 11.

S202: in a second time period, sequentially turning on all of the second color sub-pixels 12 of the display panel, and using the source driver 50 to respectively input grayscale values of the second color sub-pixels 12.

S203: in a third time period, sequentially turning on all of the third color sub-pixels 13 of the display panel, and using the source driver 50 to respectively input grayscale values of the third color sub-pixels 13.

S204: in a fourth time period, sequentially turning on all of the white color sub-pixels 14 of the display panel, and using the source driver 50 to respectively input grayscale values of the white color sub-pixels 14.

That is, in different time periods, all of the sub-pixels having different colors are turned on, and inputting grayscale values of all sub-pixels, and in a same time period, all of the sub-pixels having a same color are turned on, and inputting grayscale values of all sub-pixels.

Optionally, in the present embodiment, the source driver 50 includes multiple source driving units 51. Wherein, the number of the source driving units 51 can be determined based on a specific situation. Each source driving unit 51 is corresponding to one column of the pixels 10, and each source driving unit 51 is connected to the first color sub-pixel 11, the second color sub-pixel 12, the third color sub-pixel 13 and the white color sub-pixel 14 of the one column of the pixels 10 respectively through four data lines 40.

Figure 5:
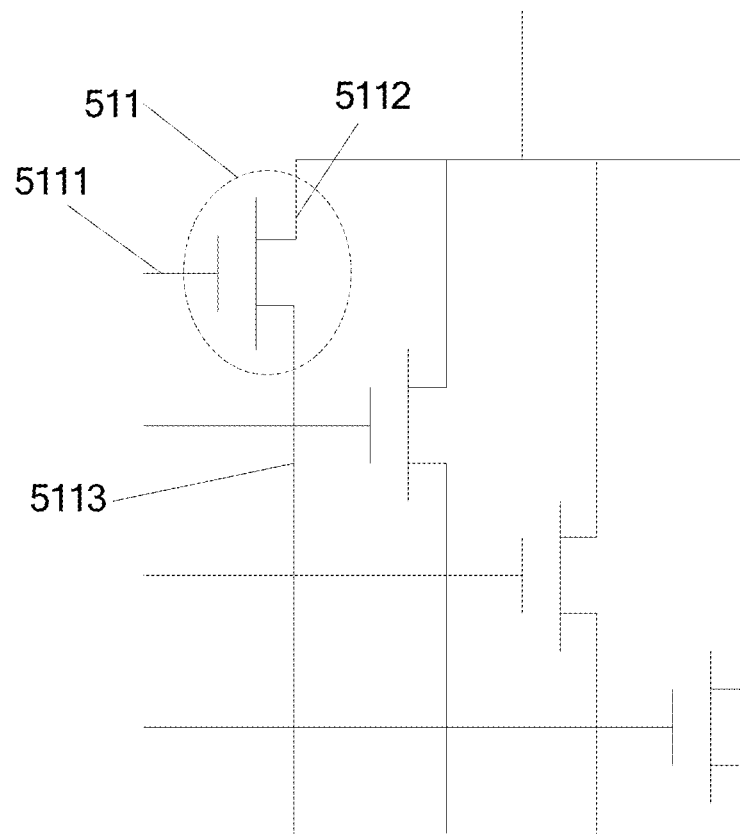
FIG. 5 is a schematic structure diagram of a source driving unit of the display panel under an application.

Optionally, in one application of the present embodiment, as shown in FIG. 5, the source driving unit 51 includes four switching elements 511. Wherein, a control terminal 5111 of each switching element 511 receives a corresponding control signal to determine if turning on the switching elements 511, a first channel terminal 5112 of each switching element 511 receives a grayscale value of a corresponding sub-pixel, and a second channel terminal 5113 of each switching element 511 is connected to a corresponding data line 40 for outputting the grayscale value of the corresponding sub-pixel to the corresponding sub-pixel in order to input the grayscale value of the corresponding sub-pixel.

Wherein, when using the source driver 50 to respectively input grayscale values of the white color sub-pixels 14, the source driver 50 decrease a preset value of gamma voltages of the white color sub-pixels 14 such that when inputting the grayscale values of the white color sub-pixels 14, the preset value of gamma voltages of the white color sub-pixels 14 is less than a preset value of gamma voltages of the first color sub-pixel 11, the second color sub-pixel 12 and/or the third color sub-pixel 13 when inputting grayscale value of the first color sub-pixel 11, the second color sub-pixel 12 and/or the third color sub-pixel 13.

In the conventional art, when inputting grayscale values of sub-pixels having different colors, the gamma voltages preset by the source driver 50 are the same such that when displaying a pure color, the pure color is dimmed. However, in the present embodiment, when inputting the grayscale values of the white sub-pixels 14, the gamma voltages is set to be smaller, which can improve the dimmed pure color problem, and increase the display quality.

In one application of the present embodiment, a sum of the first time period, the second time period, the third time period, and the fourth time period is a writing period of one frame picture. That is, the writing period of one frame picture is divided into four time periods. In each time period, grayscale values of all of the sub-pixels having a same color are inputted. Optionally, each of the first time period, the second time period, the third time period, and the fourth time period is a quarter of the writing period of one frame picture. That is, the times for inputting the grayscale values of the sub-pixels are the same. Of course, in another embodiment, the first time period, the second time period, the third time period, and the fourth time period can be not equal. For example, the first time period is one third of the writing period of one frame picture, the second time period is one third of the writing period of one frame picture, the third time period is one sixth of the writing period of one frame picture and the fourth time period is one sixth of the writing period of one frame picture. The specific time period can be designed by a designer based on actual requirement of picture display, not limited here.

Figure 6:
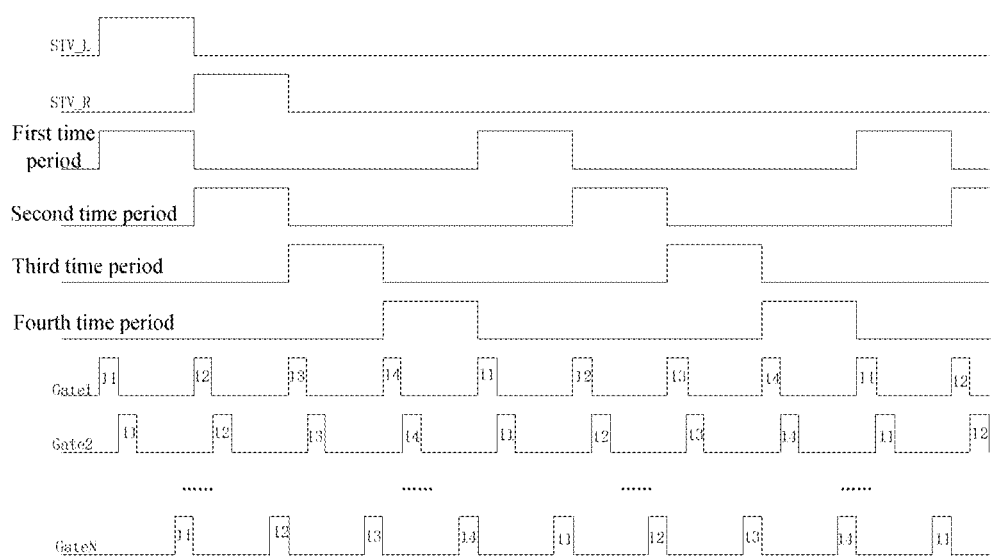
FIG. 6 is timing diagram of the driving control method for driving a display panel.

With reference to FIG. 6, and FIG. 6 is a timing diagram when the driving control method drives the display panel. In the present embodiment, the display panel adopts a row-by-row scanning method to sequentially turn on the first color sub-pixel, the second color sub-pixel, the third color sub-pixel and the white color sub-pixel respectively in the first time period, the second time period, the third time period, and the fourth time period in order to respectively input grayscale values of the first color sub-pixels, the second color sub-pixels, the third color sub-pixels and the white color sub-pixels. That is, in the present embodiment, sequentially performing a scanning based on an arrangement manner of the scanning lines 30.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A driving control method for a display panel, wherein, the display panel includes multiple pixels arranged as a matrix, each pixel includes a first color sub-pixel, a second color sub-pixel, a third color sub-pixel and a white color sub-pixel, each sub-pixel is corresponding to a thin film transistor, and each sub-pixel is connected with a corresponding scanning line and a corresponding data line through the corresponding thin film transistor;
wherein the source driver comprises multiple source driving units, each source driving unit is corresponding to one column of the pixels, and each source driving unit is respectively connected to the first color sub-pixel, the second color sub-pixel, the third color sub-pixel and the white color sub-pixel of the one column of the pixels through four data lines, and the method comprises:
in a first time period, sequentially turning on all of the first color sub-pixels of the display panel, and using a source driver to respectively input grayscale values of the first color sub-pixels;
in a second time period, sequentially turning on all of the second color sub-pixels of the display panel, and using the source driver to respectively input grayscale values of the second color sub-pixels;
in a third time period, sequentially turning on all of the third color sub-pixels of the display panel, and using the source driver to respectively input grayscale values of the third color sub-pixels;
in a fourth time period, sequentially turning on all of the white color sub-pixels of the display panel, and using the source driver to respectively input grayscale values of the white color sub-pixels;
wherein, a sum of the first time period, the second time period, the third time period, and the fourth time period is a writing period of one frame picture; when using the source driver to respectively input grayscale values of the white color sub-pixels, the source driver decreases a preset value of gamma voltages of the white color sub-pixels such that the preset value of gamma voltages when inputting grayscale values of the white color sub-pixels is less than a preset value of gamma voltages when inputting grayscale values of the first color sub-pixels, the second color sub-pixels and/or the third color sub-pixels; wherein, the first time period is one third of the writing period of one frame picture, the second time period is one third of the writing period of one frame picture, the third time period is one sixth of the writing period of one frame picture and the fourth time period is one sixth of the writing period of one frame picture.

2. The method according to claim 1, wherein, the display panel adopts a row-by-row scanning method to sequentially turn on the first color sub-pixel, the second color sub-pixel, the third color sub-pixel and the white color sub-pixel respectively in the first time period, the second time period, the third time period, and the fourth time period in order to respectively input grayscale values of the first color sub-pixels, the second color sub-pixels, the third color sub-pixels and the white color sub-pixels.

3. The method according to claim 1, wherein, each of the first color sub-pixels, the second color sub-pixels, the third color sub-pixels and the white color sub-pixels are arranged in a column-by-column manner, and between two adjacent columns having a same color, columns having the other colors of the color sub-pixel are distributed.

4. The method according to claim 1, wherein, arrangement sequences of the first color sub-pixels, the second color sub-pixels, the third color sub-pixels and the fourth color sub-pixels located at two adjacent rows and in adjacent two pixels are opposite.

5. The method according to claim 1, wherein, each source driving unit includes four switching elements, a control terminal of each switching element receives a corresponding control signal to determine if turning on the switching element, a first channel terminal of each switching element receives a grayscale value of a corresponding sub-pixel, and a second channel terminal of each switching element is connected to a corresponding data line for outputting the grayscale value of the corresponding sub-pixel to the corresponding sub-pixel in order to input the grayscale value of the corresponding sub-pixel.

6. The method according to claim 1, wherein, the first color sub-pixel, the second color sub-pixel and the third color sub-pixel are respectively a red sub-pixel, a green sub-pixel and a blue sub-pixel.

7. A driving control method for a display panel, wherein, the display panel includes multiple pixels arranged as a matrix, each pixel includes a first color sub-pixel, a second color sub-pixel, a third color sub-pixel and a white color sub-pixel; wherein the source driver comprises multiple source driving units, each source driving unit is corresponding to one column of the pixels, and each source driving unit is respectively connected to the first color sub-pixel, the second color sub-pixel, the third color sub-pixel and the white color sub-pixel of the one column of the pixels through four data lines, and the method comprises:

in a first time period, sequentially turning on all of the first color sub-pixels of the display panel, and using a source driver to respectively input grayscale values of the first color sub-pixels;

in a second time period, sequentially turning on all of the second color sub-pixels of the display panel, and using the source driver to respectively input grayscale values of the second color sub-pixels;

in a third time period, sequentially turning on all of the third color sub-pixels of the display panel, and using the source driver to respectively input grayscale values of the third color sub-pixels;

in a fourth time period, sequentially turning on all of the white color sub-pixels of the display panel, and using the source driver to respectively input grayscale values of the white color sub-pixels;

wherein, when using the source driver to respectively input grayscale values of the white color sub-pixels, the source driver decreases a preset value of gamma voltages of the white color sub-pixels such that the preset value of gamma voltages when inputting grayscale values of the white color sub-pixels is less than a preset value of gamma voltages when inputting grayscale values of the first color sub-pixels, the second color sub-pixels and/or the third color sub-pixels;

wherein, a sum of the first time period, the second time period, the third time period, and the fourth time period is a writing period of one frame picture, the first time period is one third of the writing period of one frame picture, the second time period is one third of the writing period of one frame picture, the third time period is one sixth of the writing period of one frame picture and the fourth time period is one sixth of the writing period of one frame picture.

8. The method according to claim 7, wherein, each sub-pixel is corresponding to a thin film transistor, and each sub-pixel is connected with a corresponding scanning line and a corresponding data line through the corresponding thin film transistor.

9. The method according to claim 7, wherein, the display panel adopts a row-by-row scanning method to sequentially turn on the first color sub-pixel, the second color sub-pixel, the third color sub-pixel and the white color sub-pixel respectively in the first time period, the second time period, the third time period, and the fourth time period in order to respectively input grayscale values of the first color sub-pixels, the second color sub-pixels, the third color sub-pixels and the white color sub-pixels.

10. The method according to claim 7, wherein, the first color sub-pixels, the second color sub-pixels, the third color sub-pixels and the white color sub-pixels are arranged in a column-by-column manner, and between two adjacent columns having a same color, columns having the other colors of the color sub-pixel are distributed.

11. The method according to claim 7, wherein, arrangement sequences of the first color sub-pixels, the second color sub-pixels, the third color sub-pixels and the fourth color sub-pixels located at two adjacent rows and in adjacent two pixels are opposite.

12. The method according to claim 7, wherein, each source driving unit includes four switching elements, a control terminal of each switching element receives a corresponding control signal to determine if turning on the switching element, a first channel terminal of each switching element receives a grayscale value of a corresponding sub-pixel, and a second channel terminal of each switching element is connected to a corresponding data line for outputting the grayscale value of the corresponding sub-pixel to the corresponding sub-pixel in order to input the grayscale value of the corresponding sub-pixel.

13. The method according to claim 7, wherein, the first color sub-pixel, the second color sub-pixel and the third color sub-pixel are respectively a red sub-pixel, a green sub-pixel and a blue sub-pixel.

* * * * *